United States Patent
Horibata

(10) Patent No.: US 7,495,594 B2
(45) Date of Patent: Feb. 24, 2009

(54) D/A CONVERTER AND LIQUID CRYSTAL DISPLAY DEVICE

(75) Inventor: Hiroyuki Horibata, Gifu (JP)

(73) Assignee: Epson Imaging Devices Corporation, Nagano (JP)

(*) Notice: Subject to any disclaimer, the term of this patent is extended or adjusted under 35 U.S.C. 154(b) by 0 days.

(21) Appl. No.: 11/863,002

(22) Filed: Sep. 27, 2007

(65) Prior Publication Data

US 2008/0079621 A1 Apr. 3, 2008

(30) Foreign Application Priority Data

Sep. 29, 2006 (JP) ............................. 2006-267088

(51) Int. Cl.
*H03M 1/80* (2006.01)

(52) U.S. Cl. .................. 341/153; 341/136; 341/144; 341/150; 345/89; 345/95; 345/98; 345/100

(58) Field of Classification Search ................ 341/136, 341/153

See application file for complete search history.

(56) References Cited

U.S. PATENT DOCUMENTS

| | | | |
|---|---|---|---|
| 5,332,997 A * | 7/1994 | Dingwall et al. ............. | 341/150 |
| 5,877,717 A * | 3/1999 | Tu et al. ...................... | 341/150 |
| 6,046,719 A * | 4/2000 | Dingwall ...................... | 345/100 |
| 6,380,917 B2 * | 4/2002 | Matsueda et al. ............. | 345/89 |
| 6,420,988 B1 | 7/2002 | Azami et al. | |
| 6,486,812 B1 * | 11/2002 | Tanaka ........................ | 341/144 |
| 6,606,045 B2 | 8/2003 | Azami et al. | |
| 6,614,376 B2 * | 9/2003 | Tanaka et al. ................ | 341/144 |
| 6,958,741 B2 * | 10/2005 | Tsutsui ........................ | 345/90 |
| 7,161,517 B1 * | 1/2007 | Yen et al. ..................... | 341/145 |
| 7,352,314 B2 * | 4/2008 | Horibata ...................... | 341/150 |
| 2006/0214900 A1 | 9/2006 | Tsuchi et al. | |

FOREIGN PATENT DOCUMENTS

| | | |
|---|---|---|
| JP | 8-65164 | 3/1996 |
| JP | 2000-341125 A | 12/2000 |
| JP | 2003-122326 A | 4/2003 |

* cited by examiner

*Primary Examiner*—Khai M Nguyen
(74) *Attorney, Agent, or Firm*—Morrison & Foerster LLP

(57) ABSTRACT

A D/A converter with reduced power consumption is offered by reducing an amount of electric charges that is charged and discharged as D/A conversion is performed. A terminal of each of four capacitors C1, C2, C3 and C4 is connected to a common node. The capacitors C1, C2, C3 and C4 have capacitances C, C, 2C and 4C, respectively. A selection circuit SEL is provided with selection transistors ST1, ST2, ST3, ST4, ST5 and ST6, and selects and outputs either a first reference electric potential V1 or a second electric potential V2 according to a value of each bit of the digital signals $D_0$, $D_1$ and $D_2$. Each of transfer transistors TT1, TT2 and TT3 transfers each of outputs of the selection circuit SEL to another terminal of corresponding each of the capacitors C2, C3 and C4, respectively, in response to a start pulse STP. Each of reset transistors RT1, RT2, RT3 and RT4 connects the terminal with the other terminal of corresponding each of the capacitors C1, C2, C3 and C4, and applies the first reference electric potential V1 to both the terminal and the other terminal in response to a reset pulse RST.

12 Claims, 3 Drawing Sheets

D/A CONVERTER AND LIQUID CRYSTAL DISPLAY DEVICE

CROSS-REFERENCE OF THE INVENTION

This application claims priority from Japanese Patent Application No. 2006-267088, the content of which is incorporated herein by reference in its entirety.

BACKGROUND OF THE INVENTION

1. Field of the Invention

This invention relates to a D/A converter that converts a digital signal to an analog signal and a liquid crystal display device provided with the D/A converter.

2. Description of the Related Art

In an active matrix type liquid crystal display device, when a video signal from a video source is a digital signal, the video signal has been converted from digital to analog with a D/A converter and applied to pixels to perform multi-gray scale display that corresponds to the number of bits of the digital signal.

FIG. 4 is a circuit diagram showing a conventional D/A converter. The D/A converter converts three bits of digital signals $D_0$, $D_1$ and $D_2$ into an analog signal. A terminal of each of four capacitors C1, C2, C3 and C4 is grounded. The capacitors C1, C2, C3 and C4 have capacitances C, C, 2C and 4C, respectively. That is, each of the three capacitors C2, C3 and C4 is weighted according to a weight of each bit of the digital signals $D_0$, $D_1$ and $D_2$, respectively. A selection circuit SEL selects and outputs either a first reference electric potential V1 or a second electric potential V2, according to a value of each bit of the digital signals $D_0$, $D_1$ and $D_2$.

In response to a transfer pulse TP, a transfer transistor TT1 transfers the first reference electric potential V1 to an other terminal of the capacitor C1, while each of three transfer transistors TT2, TT3 and TT4 transfers corresponding output of the selection circuit SEL to an other terminal of corresponding each of the capacitors C2, C3 and C4, respectively. In response to a charge pulse CP, charge transistors CT2, CT3 and CT4 connect the other terminals of the four capacitors C1, C2, C3 and C4 with each other, and an output transistor CT1 outputs an analog signal determined by electric charges shared among the other terminals of the four capacitors C1, C2, C3 and C4 that are connected together in response to the charge pulse CP.

FIG. 5 is an operational timing chart of the D/A converter. When the digital signals $D_0$, $D_1$ and $D_2$ are established, either the first reference electric potential V1 or the second reference electric potential V2 (V2>V1) is selected for each bit by the selection circuit SEL. After that, when the transfer pulse TP turns to an H level, the four transfer transistors TT1, TT2, TT3 and TT4 are turned on to charge the capacitors C1, C2, C3 and C4. After that, when the transfer pulse TP falls to an L level and the charge pulse CP rises to the H level, the other terminals of the capacitors C1, C2, C3 and C4 are connected together by the charge transistors CT2, CT3 and CT4 and the electric charges stored in the capacitors C1, C2, C3 and C4 are equally shared by the capacitors C1, C2, C3 and C4 to thereby determine an electric potential of the analog signal Vout. The analog signal Vout is outputted through the output transistor CT1.

Here, the analog signal Vout can be expressed by the following equation 1, according to the law of conservation of electric charge.

$$Vout = \frac{4C(V1 + D_2(V2-V1)) + 2C(V1 + D_1(V2-V1)) + C(V1 + D_0(V2-V1)) + CV1}{8C}$$ [Equation 1]

A display device using this kind of D/A converter is disclosed in Japanese Patent Application Publication No. 2003-122326.

With the D/A converter described above, however, there has been a problem that the power consumption is large because the capacitors C2, C3 and C4 must be charged and discharged to the reference voltage corresponding to the values of the digital signals $D_0$, $D_1$ and $D_2$ every time the digital signals $D_0$, $D_1$ and $D_2$ change their values.

SUMMARY OF THE INVENTION

This invention is directed to solve the problem addressed above and offers a D/A converter having a plurality of capacitors, capacitance of each of which is weighted according to a weight of each bit of digital signals and a terminal of each of which is connected with a common node, a selection circuit that selects either a first electric potential or a second electric potential according to a value of each bit of the digital signals and applies it to an other terminal of corresponding each of the capacitors, and a reset circuit that applies the first reference electric potential to both terminals of each of the capacitors in response to a reset signal, wherein an analog signal is obtained from the common node by applying each of outputs of the selection circuit to the other terminal of corresponding each of the capacitors after applying the first reference electric potential to the both terminals of the capacitors by the reset circuit.

With a structure described above, an amount of electric charges that is charged and discharged as the D/A conversion is performed is reduced to reduce the power consumption, since the D/A conversion is performed only by transferring electric charges through capacitive coupling.

DETAILED DESCRIPTION OF THE INVENTION

Figure 1:
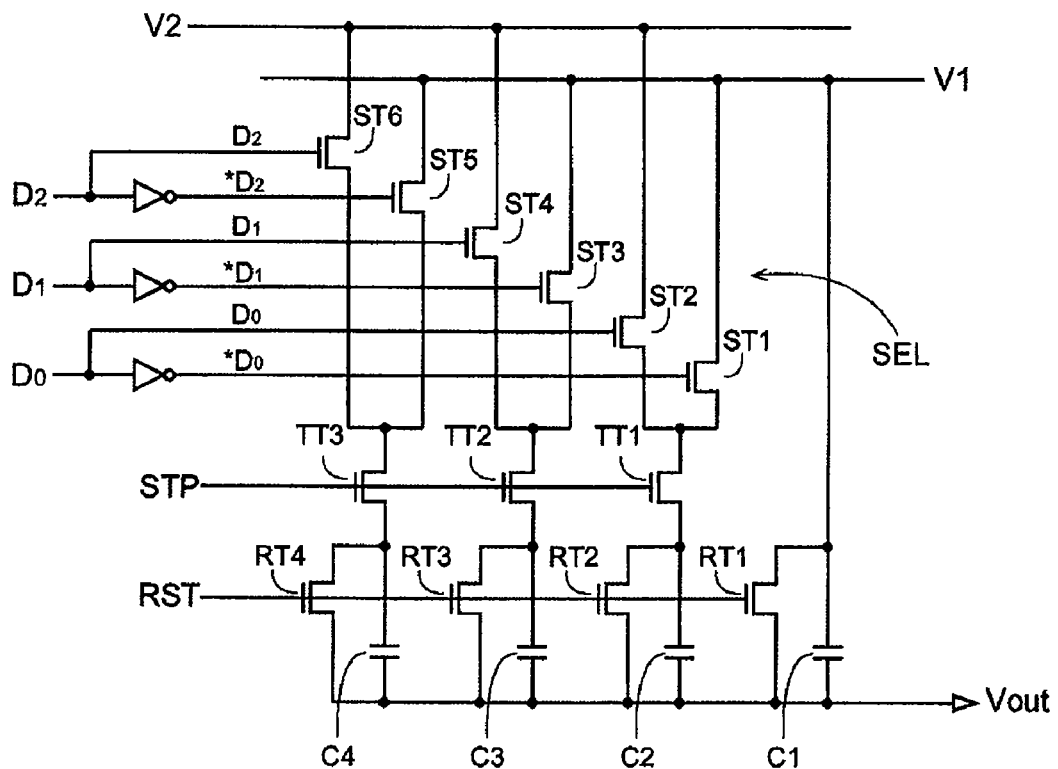
FIG. 1 is a circuit diagram showing a D/A converter according to a first embodiment of the invention.

An embodiment of this invention is described hereafter referring to the drawings. FIG. 1 is a circuit diagram of a 3-bit D/A converter according to a first embodiment of this invention. A terminal of each of four capacitors C1, C2, C3 and C4 is connected to a common node. The capacitors C1, C2, C3 and C4 have capacitances C, C, 2C and 4C, respectively. That is, each of the three capacitors C2, C3 and C4 is weighted according to a weight of each bit of digital signals $D_0$, $D_1$ and $D_2$, respectively.

A selection circuit SEL is provided with six selection transistors ST1, ST2, ST3, ST4, ST5 and ST6, and selects and outputs either a first reference electric potential V1 or a second electric potential V2 (V2>V1) according to a value of each bit of the digital signals $D_0$, $D_1$ and $D_2$.

Each of three transfer transistors TT1, TT2 and TT3 transfers each of outputs of the selection circuit SEL to the other terminal of corresponding each of the capacitors C2, C3 and C4, respectively, in response to a start pulse STP. Each of four reset transistors RT1, RT2, RT3 and RT4 connects the terminal with the other terminal of corresponding each of the capacitors C1, C2, C3 and C4, and applies the first reference electric potential V1 to both the terminal and the other terminal in response to a reset pulse RST. Although all the six selection transistors ST1, ST2, ST3, ST4, ST5 and ST6 constituting the selection circuit SEL, the three transfer transistors TT1, TT2 and TT3 and the four reset transistors RT1, RT2, RT3 and RT4 are N-channel type MOS transistors in this example, they may be P-channel type MOS transistors.

Figure 2:
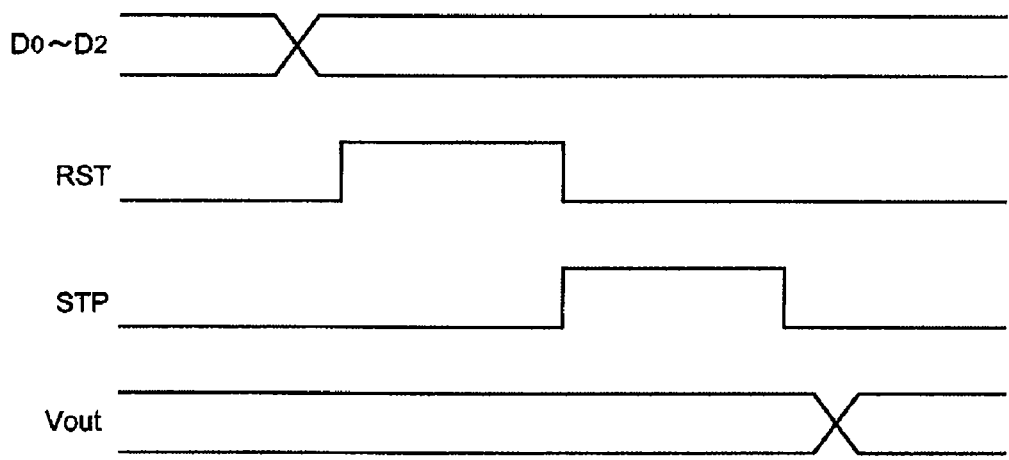
FIG. 2 is an operational timing chart of the D/A converter according to the first embodiment of the invention.

FIG. 2 is an operational timing chart of the D/A converter. When the digital signals $D_0$, $D_1$ and $D_2$ are established, either the first reference electric potential V1 or the second reference electric potential V2 (V2>V1) is selected for each bit by the selection circuit SEL.

After that, when the reset pulse RST rises to an H level, each of the four reset transistors RT1, RT2, RT3 and RT4 is turned on to connect the terminal with the other terminal of corresponding each of the capacitors C1, C2, C3 and C4, and applies the first reference electric potential V1 to both the terminals and the other terminals. Then after the reset pulse RST falls to an L level and the reset transistors RT1, RT2, RT3 and RT4 are turned off, the start pulse STP rises to the H level to turn the three transfer transistors TT1, TT2 and TT3 on.

Then, each of the selected outputs of the selection circuit SEL is applied through each of the transfer transistors TT1, TT2 and TT3 to the other terminal of corresponding each of the capacitors C2, C3 and C4, respectively. With this, an electric potential at the terminals of the capacitors C1, C2, C3 and C4 which are connected to the common node varies through capacitive coupling, and the analog signal Vout corresponding to the digital signals $D_0$, $D_1$ and $D_2$ is obtained from the common node. The analog signal Vout takes the same value as represented by the equation 1.

According to the first embodiment of this invention, an amount of electric charges that is charged and discharged as the D/A conversion is performed is reduced and the power consumption can be reduced by about 50% compared with the conventional circuit, since the D/A conversion is performed only by transferring electric charges through the capacitive coupling of the capacitors C1, C2, C3 and C4.

For example, assuming that V1=4 V, V2=5 V and the capacitances of the capacitors C1, C2, C3 and C4 are 0.5 pF, 0.5 pF, 1.0 pF and 2.0 pF, respectively, the analog signal Vout is represented by an equation 2 and a table 1.

TABLE 1

[Equation 2]
$$V_{out} = 4 + \frac{4D_2 + 2D_1 + D_0}{8}$$

| D2 | D1 | D0 | Analg Signal Vout |
|---|---|---|---|
| 0 | 0 | 0 | 4.00 V |
| 0 | 0 | 1 | 4.125 V |
| 0 | 1 | 0 | 4.25 V |
| 0 | 1 | 1 | 4.375 V |
| 1 | 0 | 0 | 4.50 V |
| 1 | 0 | 1 | 4.625 V |
| 1 | 1 | 0 | 4.75 V |
| 1 | 1 | 1 | 4.875 V |

The 3-bit D/A converter is described in this embodiment. A 2-bit D/A converter and a 4-bit D/A converter can be formed similarly.

The D/A converter may be formed on a glass substrate 30 together with a display panel 30 in which a matrix of pixels is formed, by means of SOG (System on Glass) that integrates circuit functions necessary to drive a liquid crystal display device 40 on the glass substrate 30 using a low temperature polysilicon technology. With this, the number of semiconductor parts can be reduced, assembly can be simplified and an external circuit board can be reduced, thereby overall reduction in size and weight can be achieved.

Figure 3:
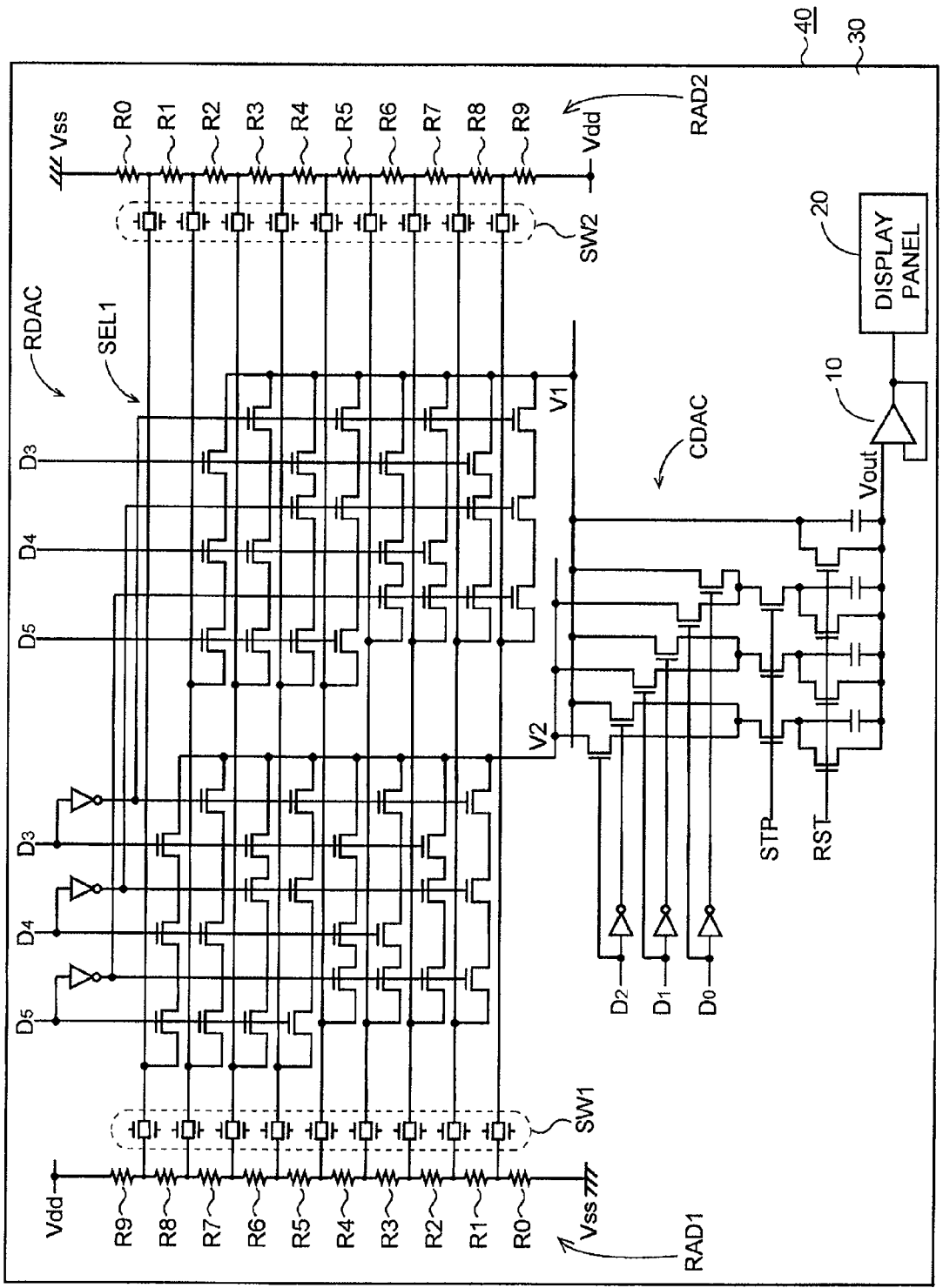
FIG. 3 is a circuit diagram showing a D/A converter according to a second embodiment of the invention.
Figure 4:
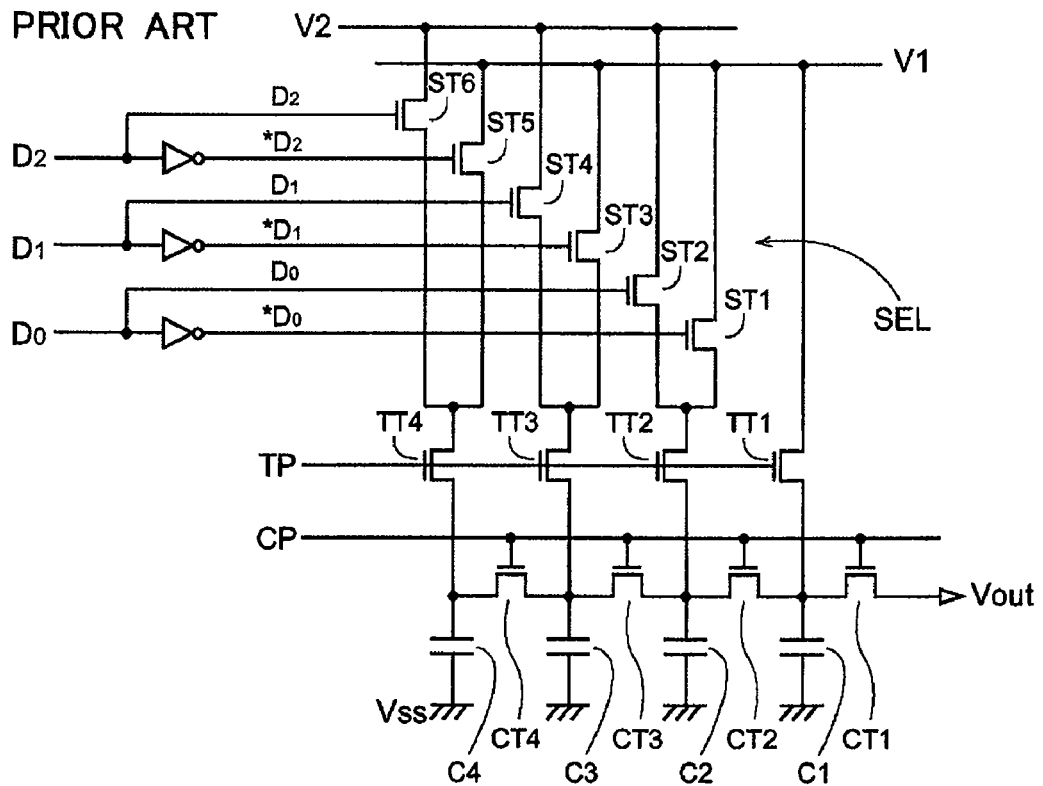
FIG. 4 is a circuit diagram showing a conventional D/A converter.
Figure 5:
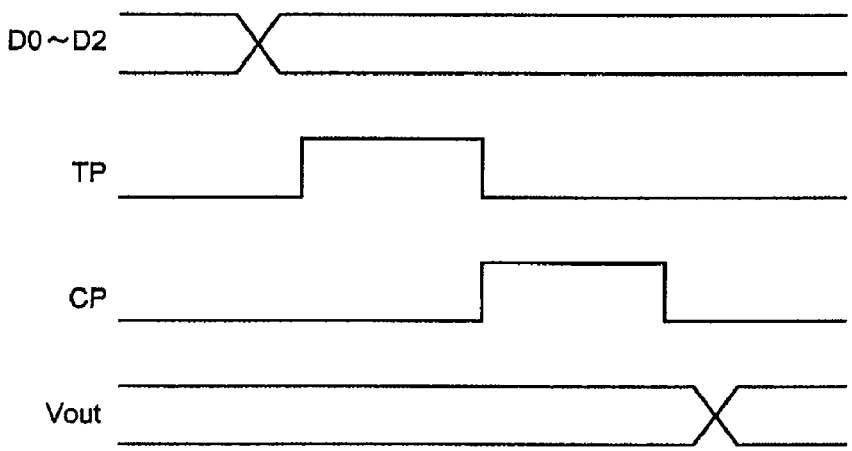
FIG. 5 is an operational timing chart of the conventional D/A converter.

FIG. 3 is a circuit diagram of a D/A converter according to a second embodiment of this invention. The D/A converter is used for D/A conversion of video signals of a liquid crystal l display device. Upper three bits of video signals $D_3$, $D_4$ and $D_5$ out of six bits of video signals $D_0$, $D_1$, $D_2$, $D_3$, $D_4$ and $D_5$ are converted from digital to analog with a first D/A converter RDAC which uses ladder resistors, while lower three bits of video signals $D_0$, $D_1$ and $D_2$ are converted from digital to analog with a second D/A converter CDAC which is the same D/A converter as described in the first embodiment and uses the capacitive coupling. In this case, a first reference electric potential V1 and a second reference electric potential V2 that are outputs of the first D/A converter RDAC are inputted to the second D/A converter CDAC.

The first D/A converter RDAC is provided with a first ladder resistor RAD1 for a positive electrode and a second ladder resistor RAD2 for a negative electrode in order for line inversion of the liquid crystal display device. The first ladder resistor RAD1 and the second ladder resistor RAD2 can be switched by first switches SW1 and second switches SW2, respectively.

In the first ladder resistor RAD1 for the positive electrode, there are ten resistors R0-R9 connected in series between a power supply electric potential Vdd and a ground electric potential Vss and nine reference electric potentials are taken out from nine connecting nodes between the ten resistors R0-R9. The second ladder resistor RAD2 is structured similarly. However, the nine reference electric potentials are taken out in a reverse order.

A selection circuit SEL1 selects a couple of the reference electric potentials that are next to each other in terms of a magnitude of the electric potential out of the nine reference electric potentials according to values of the upper three bits of the video signals $D_3$, $D_4$ and $D_5$ and outputs them to the second D/A converter CDAC as the first reference electric potential V1 and the second reference electric potential V2. The selection circuit SEL1 is provided with 48 selection transistors. All of them are N-channel type MOS transistors in this example. In the second D/A converter CDAC, the lower three bits of the video digital signals $D_0$, $D_1$ and $D_2$ are converted from digital to analog and an analog signal Vout is outputted. The analog signal Vout is applied to pixels in a display panel 20 through an operational amplifier 10.

The number of elements can be significantly reduced with this D/A converter compared with the case in which all six bits of the digital video signals $D_0$, $D_1$, $D_2$, $D_3$, $D_4$ and $D_5$ are converted from digital to analog with the first D/A converter RDAC which uses the ladder resistors. Also, the power consumption can be reduced with the second D/A converter CDAC as in the first embodiment.

Although the upper three bits of the video signals $D_3$, $D_4$ and $D_5$ out of the six bits of the video signals $D_0$, $D_1$, $D_2$, $D_3$, $D_4$ and $D_5$ are converted from digital to analog with the first D/A converter RDAC which uses the ladder resistors while the lower three bits of the video signals $D_0$, $D_1$ and $D_2$ are converted from digital to analog with the second D/A converter CDAC which uses the capacitive coupling in the second embodiment, this invention is not limited to the above, and upper two bits of the video signals $D_4$ and $D_5$ out of the six bits of the video signals $D_0$, $D_1$, $D_2$, $D_3$, $D_4$ and $D_5$ may be converted from digital to analog with the first D/A converter RDAC which uses the ladder resistors and the lower four bits of the video signals $D_0$, $D_1$, $D_2$ and $D_3$ may be converted from digital to analog with the second D/A converter CDAC which uses the capacitive coupling, for example. Also, the number of bits of the digital video signals may be increased or decreased as deemed appropriate, and the D/A converter may be structured accordingly.

With the D/A converter according to the embodiment of this invention, the amount of electric charges that is charged and discharged as the D/A conversion is performed is reduced, making it possible to reduce the power consumption. The D/A converter is particularly suitable when it is used in D/A conversion of digital video signals of a display device such as a liquid crystal display device.

What is claimed is:

1. A D/A converter comprising:
   a plurality of capacitors, each having a capacitance weighted according to a weight of a corresponding bit of digital signals and comprising a first terminal connected with a common node and a second terminal;
   a selection circuit that selects, for each of the capacitors, either a first reference electric potential or a second reference electric potential according to a value of a corresponding bit of the digital signals and applies the selected reference electric potential to the second terminal of a corresponding capacitor; and
   a reset switch provided for each of the capacitors and connecting, in response to a reset signal, the first and second terminals of a corresponding capacitor so that the first reference electric potential is applied to the first and second terminals of the corresponding capacitor,
   wherein the converter is configured so that an analog signal is obtained from the common node by applying the selected reference electric potentials to the second terminals of the capacitors after applying the first reference electric potential to the first and second terminals of the capacitors by the reset switches.

2. The D/A converter of claim 1, further comprising a transfer transistor provided for each of the capacitors and applying the selected reference electric potential to the second terminal of a corresponding capacitor in response to a start pulse.

3. A D/A converter comprising:
   a reference electric potential generation circuit that generates $(2^m+1)$ reference electric potentials corresponding to upper m bits of digital signals out of n bits of the digital signals;
   a first selection circuit that selects a first reference electric potential and a second reference electric potential out of the $(2^m+1)$ reference electric potentials according to values of the upper m bits of the digital signals, the first and second reference electric potentials being next to each other in terms of the order of magnitude of the reference electric potential;
   a plurality of capacitors, each having a capacitance weighted according to a weight of corresponding one of lower (n−m) bits of the digital signals and comprising a first terminal connected with a common node and a second terminal;
   a second selection circuit that selects, for each of the capacitors, either the first reference electric potential or the second reference electric potential according to a value of corresponding one of the lower (n−m) bits of the digital signals and applies the selected reference electric potential to the second terminal of a corresponding capacitor; and
   a reset switch provided for each of the capacitors and connecting, in response to a reset signal, the first and second terminals of a corresponding capacitor so that the first reference electric potential is applied to the first and second terminals of the corresponding capacitor,
   wherein the converter is configured so that an analog signal is obtained from the common node by applying the selected reference electric potentials to the second terminals of the capacitors after applying the first reference electric potential to the first and second terminals of the capacitors by the reset switches.

4. The D/A converter of claim 3, further comprising a transfer transistor provided for each of the capacitors and applying the selected reference electric potential to the second terminal of a corresponding capacitor in response to a start pulse.

5. A liquid crystal display device comprising:
   a plurality of capacitors, each having a capacitance weighted according to a weight of a corresponding bit of digital signals and comprising a first terminal connected with a common node and a second terminal;
   a selection circuit that selects, for each of the capacitors, either a first reference electric potential or a second reference electric potential according to a value of a corresponding bit of the digital signals and applies the selected reference electric potential to the second terminal of a corresponding capacitor;
   a reset switch provided for each of the capacitors and connecting, in response to a reset signal, the first and second terminals of a corresponding capacitor so that the first reference electric potential is applied to the first and second terminals of the corresponding capacitor; and
   a display panel,
   wherein the device is configured so that an analog signal is obtained from the common node by applying the selected reference electric potentials to the second terminals of the capacitors after applying the first reference electric potential to the first and second terminals of the capacitors by the reset switches, and
   the analog signal is supplied to the display panel.

6. The liquid crystal display device of claim 5, further comprising a transfer transistor provided for each of the capacitors and applying the selected reference electric potential to the second terminal of a corresponding capacitor in response to a start pulse.

7. The liquid crystal display device of claim 6, further comprising a glass substrate, wherein the display panel comprises a matrix of pixels formed on the glass substrate, and the capacitors, the selection circuit and the reset switches are formed on the glass substrate using a low temperature polysilicon technology.

8. The liquid crystal display device of claim 5, further comprising a glass substrate, wherein the display panel comprises a matrix of pixels formed on the glass substrate, and the capacitors, the selection circuit and the reset switches are formed on the glass substrate using a low temperature polysilicon technology.

9. A liquid crystal display device comprising:
- a reference electric potential generation circuit that generates ($2^m+1$) reference electric potentials corresponding to upper m bits of digital signals out of n bits of the digital signals;
- a first selection circuit that selects a first reference electric potential and a second reference electric potential out of the ($2^m+1$) reference electric potentials according to values of the upper m bits of the digital signals, the first and second reference electric potentials being next to each other in terms of the order of magnitude of the reference electric potential;
- a plurality of capacitors, each having a capacitance weighted according to a weight of corresponding one of lower (n−m) bits of the digital signals and comprising a first terminal connected with a common node and a second terminal;
- a second selection circuit that selects, for each of the capacitors, either the first reference electric potential or the second reference electric potential according to a value of corresponding one of the lower (n−m) bits of the digital signals and applies the selected reference electric potential to the second terminal of a corresponding capacitor;
- a reset switch provided for each of the capacitors and connecting, in response to a reset signal, the first and second terminals of a corresponding capacitor so that the first reference electric potential is applied to the first and second terminals of the corresponding capacitor; and
- a display panel,
- wherein the device is configured so that an analog signal is obtained from the common node by applying the selected reference electric potentials to the second terminals of the capacitors after applying the first reference electric potential to the first and second terminals of the capacitors by the reset switches, and
- the analog signal is supplied to the display panel.

10. The liquid crystal display device of claim 9, further comprising a transfer transistor provided for each of the capacitors and applying the selected reference electric potential to the second terminal of a corresponding capacitor in response to a start pulse.

11. The liquid crystal display device of claim 10, further comprising a glass substrate, wherein the display panel comprises a matrix of pixels formed on the glass substrate, and the capacitors, the selection circuit and the reset switches are formed on the glass substrate using a low temperature polysilicon technology.

12. The liquid crystal display device of claim 9, further comprising a glass substrate, wherein the display panel comprises a matrix of pixels formed on the glass substrate, and the capacitors, the selection circuit and the reset switches are formed on the glass substrate using a low temperature polysilicon technology.

* * * * *